(12) United States Patent
Zeng et al.

(10) Patent No.: US 12,557,300 B2
(45) Date of Patent: Feb. 17, 2026

(54) MEMORY SYSTEM PACKAGING STRUCTURE, AND METHOD FOR FORMING THE SAME

(71) Applicant: YANGTZE MEMORY TECHNOLOGIES CO., LTD., Wuhan (CN)

(72) Inventors: Xinru Zeng, Wuhan (CN); Peng Chen, Wuhan (CN); Houde Zhou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 488 days.

(21) Appl. No.: 18/097,481

(22) Filed: Jan. 16, 2023

(65) Prior Publication Data

US 2023/0209842 A1    Jun. 29, 2023

Related U.S. Application Data

(63) Continuation of application No. PCT/CN2022/136783, filed on Dec. 6, 2022.

(30) Foreign Application Priority Data

Dec. 28, 2021 (CN) .......................... 202111630406.4

(51) Int. Cl.
*H10B 80/00* (2023.01)
*H01L 21/56* (2006.01)
(Continued)

(52) U.S. Cl.
CPC ........... *H10B 80/00* (2023.02); *H01L 21/565* (2013.01); *H01L 21/568* (2013.01);
(Continued)

(58) Field of Classification Search
CPC ..... H10B 80/00; H01L 21/565; H01L 21/568; H01L 23/293; H01L 23/3135;
(Continued)

(56) References Cited

U.S. PATENT DOCUMENTS 11,538,746 B2 * 12/2022 Ding ........................ H01L 24/20
2017/0125378 A1    5/2017 Park et al.
(Continued)

FOREIGN PATENT DOCUMENTS

| CN | 104795386 A | 7/2015 |
| CN | 105830212 A | 8/2016 |

(Continued)

OTHER PUBLICATIONS

Notice of Reasons for Refusal issued in corresponding Japanese Application No. 2023-538666, dated Jul. 2, 2024, 7 pages.
(Continued)

*Primary Examiner* — Jasmine J Clark
(74) *Attorney, Agent, or Firm* — BAYES PLLC

(57) ABSTRACT

The present disclosure provides a memory system packaging structure and fabrication methods. The memory system packaging structure includes memory modules, a memory controller, a redistribution layer electrically connected to the memory controller, a plastic encapsulation layer encapsulating the memory modules and the memory controller, and one or more connecting pillars extending in the vertical direction and configured for providing electric power to the memory modules. Each memory module includes memory dies stacked in a vertical direction. Each connecting pillar
(Continued)

includes a first portion being in physical contact with one of the memory dies and a second portion being in physical contact with the redistribution layer.

20 Claims, 10 Drawing Sheets

(51) Int. Cl.
    *H01L 23/00*    (2006.01)
    *H01L 23/29*    (2006.01)
    *H01L 23/31*    (2006.01)
    *H01L 23/498*   (2006.01)

(52) U.S. Cl.
    CPC ........ *H01L 23/293* (2013.01); *H01L 23/3135* (2013.01); *H01L 23/49816* (2013.01); *H01L 24/16* (2013.01); *H01L 24/17* (2013.01); *H01L 24/48* (2013.01); *H01L 24/73* (2013.01); *H01L 24/13* (2013.01); *H01L 24/32* (2013.01); *H01L 2224/13147* (2013.01); *H01L 2224/1601* (2013.01); *H01L 2224/16225* (2013.01); *H01L 2224/1703* (2013.01); *H01L 2224/32145* (2013.01); *H01L 2224/48147* (2013.01); *H01L 2224/73203* (2013.01); *H01L 2224/73207* (2013.01); *H01L 2224/73253* (2013.01); *H01L 2924/1438* (2013.01)

(58) Field of Classification Search
    CPC ... H01L 23/49816; H01L 24/16; H01L 24/17; H01L 24/48; H01L 24/73; H01L 24/13; H01L 24/32; H01L 2224/13147; H01L 2224/1601; H01L 2224/16225; H01L 2224/1703; H01L 2224/32145; H01L 2224/48147; H01L 2224/73203; H01L 2224/73207; H01L 2224/73253; H01L 2924/1438
See application file for complete search history.

(56) References Cited

U.S. PATENT DOCUMENTS

| | | |
|---|---|---|
| 2017/0194292 A1 | 7/2017 | Yu et al. |
| 2017/0287870 A1 | 10/2017 | Fang et al. |
| 2018/0019228 A1 | 1/2018 | Zhang et al. |
| 2018/0233484 A1 | 8/2018 | Lin et al. |
| 2019/0229092 A1 | 7/2019 | Ding et al. |
| 2020/0411478 A1 | 12/2020 | Chen et al. |

FOREIGN PATENT DOCUMENTS

| | | |
|---|---|---|
| CN | 106653628 A | 5/2017 |
| CN | 110050340 A | 7/2019 |
| CN | 111066144 A | 4/2020 |
| CN | 111554649 A | 8/2020 |
| CN | 112599498 A | 4/2021 |
| CN | 114400218 A | 4/2022 |
| JP | 2018160157 A | 10/2018 |
| KR | 20150085687 A | 7/2015 |
| WO | 2016049940 A1 | 4/2016 |
| WO | 2020125073 A1 | 6/2020 |

OTHER PUBLICATIONS

Decision of Refusal issued in corresponding Japanese Application No. 2023-538666, dated Dec. 10, 2024, 7 pages with machine translation.

International Search Report issued in corresponding International Application No. PCT/CN2022/136783 mailed Jan. 20, 2023, 3 pages.

Supplementary European Search Report issued in corresponding European Application No. 22914071.0, mailed on Jul. 24, 2025, 13 pages.

* cited by examiner

MEMORY SYSTEM PACKAGING STRUCTURE, AND METHOD FOR FORMING THE SAME

CROSS-REFERENCE TO RELATED APPLICATIONS

This application is a continuation of Internal Application No. PCT/CN2022/136783, filed Dec. 6, 2022, entitled "MEMORY SYSTEM PACKAGING STRUCTURE, AND METHOD FOR FORMING THE SAME," which claims the benefit of priority to China Application No. 202111630406.4, filed on Dec. 28, 2021, both of which are incorporated herein by reference in their entireties.

TECHNICAL FIELD

The present disclosure relates to semiconductor storage, and in particular, to a memory system packaging structure and a fabrication method thereof.

BACKGROUND

A memory system mainly includes a memory die and a memory controller. In some examples, the memory system may include a solid-state drive (SSD), etc. A memory system packaging structure is to wrap the memory die and the memory controller with a housing, which not only plays the role of mounting, fixing, sealing, and protecting the memory die and the memory controller, but also enhances the electrical and thermal performance. Through the bond pads on the memory die and the lead-out pads of the memory controller, the memory die and memory controller are wired to pins of the packaging housing. These pins are in turn connected to other devices through wires on the circuit board, thereby connecting the memory system to external circuits. The packaging of the memory system is very important, because the packaging quality of the memory system directly affects the performance of the memory system, and affects the design and manufacture of the circuit board connected to the memory system.

However, there are many issues with traditional memory system packaging. It is urgent to develop a novel memory system packaging structure and manufacturing method.

SUMMARY

In one aspect, a memory system packaging structure includes memory modules each having memory dies stacked in a vertical direction; a memory controller; a redistribution layer having a first surface electrically connected to the memory controller; a plastic encapsulation layer encapsulating the memory modules, the memory controller, and the redistribution layer; and one or more connecting pillars extending in the vertical direction and configured for providing electric power to the memory modules. Each connecting pillar includes a first portion being in physical contact with one of the memory dies and a second portion being in physical contact with the redistribution layer.

In some implementations, the memory modules include a first memory module and a second memory module, and the first memory module and the second memory module are respectively positioned on two sides of the memory controller.

In some implementations, the first memory module has a first distance from the memory controller, the second memory module has a second distance from the memory controller, and the first distance is the same as the second distance.

In some implementations, the first memory module, the second memory module, and the memory controller are arranged in a straight line, such that the memory controller is located between the first memory module and the second memory module.

In some implementations, edges of two adjacent dies of the stacked dies are misaligned such that an upper one of the two adjacent dies has an extended portion located beyond a lower one of the two adjacent dies, and the lower one of the two adjacent dies has an uncovered portion located beyond the upper one of the two adjacent dies, and the uncovered portion of the lower one of the two adjacent dies includes a bonding pad.

In some implementations, the first memory module includes first memory dies misaligned in a first direction by a third distance, and the second memory module includes second memory dies misaligned in a second direction by a fourth distance, and the third distance is equal to the fourth distance.

In some implementations, the first memory dies and the second memory dies are both stacked in the vertical direction, the first direction and the second direction are both perpendicular to the vertical direction, and the first direction is opposite to the second direction.

In some implementations, a first number of the first memory dies is equal to a second number of the second memory dies.

In some implementations, one connecting pillar in the first memory module is physically attached to the bonding pad of one of a first subset of the first memory dies, while a second subset of memory dies of the first memory dies are connected to the first portion of the connecting pillar in the first memory module by bonding wires, and one connecting pillar in the second memory module is physically attached to the bonding pad of one of a second subset of the second memory dies, while a second subset of memory dies of the second memory dies are connected to the first portion of the connecting pillar in the second memory module by bonding wires.

In some implementations, each connecting pillar in the first memory module is respectively physically attached to the bonding pad of each of the first memory dies, and each connecting pillar in the second memory module is respectively physically attached to the bonding pad of each of the second memory dies.

In some implementations, the one or more connecting pillars include one or more copper pillars.

In some implementations, the memory system packaging structure includes metal solder balls located on a second surface of the redistribution layer, where metal solder balls are electrically connected to the one or more memory modules and the memory controller through the redistribution layer, and the second surface and the first surface are opposite to each other.

In some implementations, the memory system packaging structure includes at least one passive device encapsulated in the plastic encapsulation layer. The at least one passive device is disposed on the first surface of the redistribution layer and electrically connected to the redistribution layer.

In some implementations, the first memory dies and the second memory dies comprise three-dimensional NAND flash memory dies.

In another aspect, a memory system packaging structure includes a memory module having memory dies stacked in a vertical direction; a memory controller; a redistribution layer having a first surface electrically connected to the memory controller; a plastic encapsulation layer encapsulating the memory module, the memory controller, and the redistribution; and one or more connecting pillars extending in the vertical direction and configured for providing electric power to the memory module. Each connecting pillar includes a first portion being in physical contact with one of the memory dies and a second portion being in physical contact with the redistribution layer.

In some implementations, edges of two adjacent dies of the stacked dies are misaligned such that an upper one of the two adjacent dies has an extended portion located beyond a lower one of the two adjacent dies, and the lower one of the two adjacent dies has an uncovered portion located beyond the upper one of the two adjacent dies, and the uncovered portion of the lower one of the two adjacent dies includes a bonding pad.

In some implementations, one connecting pillar in the memory module is physically attached to the bonding pad of one of a first subset of the memory dies, while a second subset of memory dies of the memory dies are connected to the first portion of the one connecting pillar in the memory module by bonding wires.

In some implementations, at least two connecting pillars in the memory module are respectively physically attached to two bonding pads of two of a first subset of the memory dies, while a second subset of memory dies of the memory dies are connected to the first portions of the two connecting pillars in the memory module by bonding wires.

In some implementations, each connecting pillar in the memory module is respectively physically attached to the bonding pad of each of the memory dies.

In some implementations, the one or more connecting pillars comprise one or more copper pillars.

In some implementations, the memory system packaging structure includes metal solder balls located on a second surface of the redistribution layer. The metal solder balls are electrically connected to the memory module and the memory controller through the redistribution layer, and the second surface and the first surface are opposite to each other.

In some implementations, the memory system packaging structure includes at least one passive device encapsulated in the plastic encapsulation layer. The at least one passive device is disposed on the first surface of the redistribution layer and electrically connected to the redistribution layer.

In some implementations, the memory dies include three-dimensional NAND flash memory dies.

In still another aspect, a method for packaging a memory system includes the following operations. Providing one or more memory modules, each memory module having memory dies stacked in a vertical direction, and one or more connecting pillars configured for providing electric power to the one or more memory modules; providing a memory controller having a lead-out pad; mounting the one or more memory modules and the memory controller to a first surface of a redistribution layer, and the redistribution layer is configured to electrically connect the one or more connecting pillars of the one or more memory modules to the lead-out pad of the memory controller; and forming a plastic encapsulating layer encapsulating the one or more memory modules, the memory controller, the redistribution layer, and the one or more connecting pillars.

In some implementations, mounting the one or more memory modules and the memory controller to a redistribution layer includes physically connecting a first portion of each connecting pillar with one of the memory dies, and physically connecting a second portion of each connecting pillar with the redistribution layer.

In some implementations, providing one or more modules includes: providing a first carrier; stacking the memory dies sequentially on the first carrier in a misaligned manner, such that a bonding pad of each memory die is uncovered; forming the one or more connecting pillars on one or more bonding pads of the memory dies, wherein the first portions of the one or more connecting pillars are in physical contact with corresponding one or more bonding pads; forming a molding layer encapsulating the memory dies and connecting pillars; removing the first carrier; and removing a portion of the molding layer to expose second portions of the one or more connecting pillars.

In some implementations, providing one or more modules includes: providing a first carrier; stacking first memory dies and second memory dies sequentially on the first carrier, wherein the first memory dies and the second memory dies are arranged in parallel on the first carrier; forming one or more first connecting pillars on one or more bonding pads of the first memory dies, wherein first portions of the one or more first connecting pillars are in physical contact with corresponding one or more bonding pads of the first memory dies; forming one or more second connecting pillars on one or more bonding pads of the second memory dies, wherein first portions of the one or more second connecting pillars are in physical contact with corresponding one or more bonding pads of the second memory dies; forming a molding layer encapsulating the first memory dies, the second memory dies, the one or more first connecting pillars, and the one or more second connecting pillars; removing the first carrier; removing a portion of the molding layer to expose second portions of the one or more first and second connecting pillars; and cutting the molding layer to obtain a first memory module and a second memory module, wherein the first memory module comprises the first memory dies and the one or more first connecting pillars, and the second memory module comprises the second memory dies and the one or more second connecting pillars.

In some implementations, providing the one or more memory modules includes misaligning edges of two adjacent dies of the memory dies such that an upper one of the two adjacent dies has an extended portion located beyond a lower one of the two adjacent dies, and the lower one of the two adjacent dies has an uncovered portion located beyond the upper one of the two adjacent dies, wherein the bonding pad of each die is located on the uncovered portion of the lower one of the two adjacent dies.

In some implementations, the method further includes misaligning edges of two adjacent dies in a first direction by a third distance and misaligning the second memory dies in a second direction by a fourth distance. The first direction and the second direction are opposite directions both being perpendicular to the vertical direction, and the third distance is equal to the fourth distance.

In some implementations, forming the plastic encapsulation layer includes: providing a second carrier; mounting the one or more memory modules and the memory controller on the second carrier, where second portions of the one or more connecting pillars in the one or more memory modules are on a same surface of the second carrier with the lead-out pad of the memory controller; forming the plastic encapsulation layer to encapsulate the one or more memory modules and the memory controller; and removing the second carrier.

In some implementations, mounting the one or more memory modules and the memory controller includes arranging a first memory module, a second memory module, and the memory controller in a straight line, such that the memory controller is located between the first memory module and the second memory module.

In some implementations, the method further includes forming metal solder balls on a second surface of the redistribution layer. The metal solder balls, through the redistribution layer, are electrically connected with the one or more memory modules and the memory controller located on the first surface of the redistribution layer, and the second surface and the first surface are opposite to each other.

BRIEF DESCRIPTION OF THE DRAWINGS

The accompanying drawings, which are incorporated herein and form a part of the specification, illustrate aspects of the present disclosure and, together with the description, further explain the present disclosure and enable a person skilled in the pertinent art to make and use the present disclosure.

DETAILED DESCRIPTION

Figure 1A:
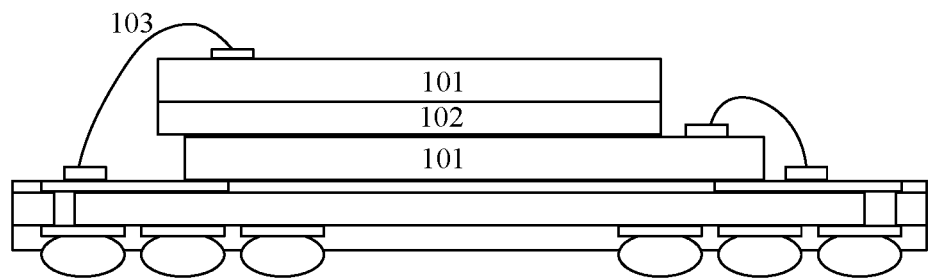
FIG. 1A is a schematic diagram of a memory system packaging structure using a wire bonding process.

Although specific configurations and arrangements are discussed, it should be understood that this is done for illustrative purposes only. As such, other configurations and arrangements can be used without departing from the scope of the present disclosure. Also, the present disclosure can be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," may be understood to convey a singular usage or to convey a plural usage, depending at least in part upon context. In addition, the term "based on" may be understood as not necessarily intended to convey an exclusive set of factors and may, instead, allow for the existence of additional factors not necessarily expressly described, depending at least in part on the context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, "bond pad" is a term generally referring to electrical bond pads in association with test points or external electrical connections of an integrated electronic device such as an integrated circuit (IC) or Micro-Electro-Mechanical System device. Related industry terms are "bonding pad" and "bump." As used herein, "solder bump" or "solder ball" are terms generally referring to a ball of solder bonded to a bond pad for further assembly of the die into packages by the use of surface mount technology or wire bonding.

As used herein, the term "die" generally refers to a small piece of a processed semiconductor wafer that is diced into sections containing integrated circuits or other devices. The term "die stack" generally refers to a vertical assembly of two or more dies containing integrated circuits that are interconnected to function as a unit.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as glass, plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "connected" refers to a direct connection, such as an electrical or mechanical connection between the things that are connected, without any intermediary devices.

As used herein, the term "circuit" may refer to one or more passive and/or active components that are arranged to cooperate with one another to provide a desired function. The term "IC" is a microelectronic circuit produced monolithically on semiconductor wafer substrates by microfabrication methods.

As used herein, the term "edge misaligned" generally refers to a stack of dies having one or more edges misaligned horizontally or laterally from each other.

As used herein, the term "top surface" refers to the surface of a structure that is the farthest away from the substrate the structure is formed on/in and the term "bottom surface" refers to the surface of a structure that is the closest to the substrate the structure is formed on/in. In the present disclosure, the relative positions of the top surface and the bottom surface do not change as the orientation of the object changes.

In the present disclosure, the elevation of a surface of an object is defined as the distance between the surface and the substrate on/in which the object is formed. In the present disclosure, the relative position of the two surfaces is defined based on the elevations of the two surfaces and does not change as the orientation of the objects change.

As used herein, the terms "stair," "step," and "level" can be used interchangeably. As used herein, a staircase structure refers to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stair" refers to a vertical shift in the height of a set of adjoined surfaces. A "staircase structure" refers to a structure having a plurality of stairs extending vertically.

As used herein, the terms "first," "second," etc., are used to distinguish similar objects, and are not necessarily used to describe a specific order or sequence.

It should be noted that the technical solutions described in the implementations of the present disclosure may be combined arbitrarily if there is no conflict.

Figure 1B:
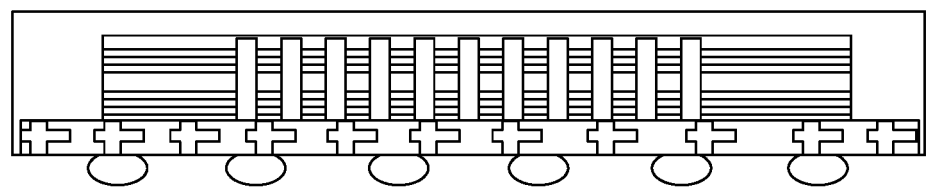
FIG. 1B is a schematic diagram of a memory system packaging structure using a TSV process.

Traditionally, the packaging of memory dies generally uses a wire bonding (WB) process and through silicon via (TSV) process. As shown in FIG. 1A, the wire bonding process involves bonding memory dies 101 using adhesive layers 102 and forming wire loops 103 on the surface of the memory dies. The TSV process as shown in FIG. 1B involves forming multiple through-silicon vias in a stack of multiple memory dies. However, the traditional memory system packaging has the following issues: 1) the wire bonding process increases the area of the entire package structure by more than 20% due to the existence of bent wires between the pads and the substrate; 2) the wire bonding process has a long conductive path, which limits the high-frequency performance of the memory dies; 3) during the wire bonding process, wire arc will occupy a certain height of the package, which will affect the design of the packaging structure; 4) the time of wire bonding process (also called as Production Time) is long and wire-bonding machines are needed; 5) semiconductor substrates (SBT) need to do ultra-small line/space and the cost increases exponentially with the reduction of line/space size; 6) holes need to be punched during the SBT production process and these holes will not be filled with metal in the subsequent production process, which will increase resistance and affect the high-frequency performance of the product; and 7) the TSV process requires the cooperation of chip design and chip packaging, which is technically difficult and costly.

Figure 1C:
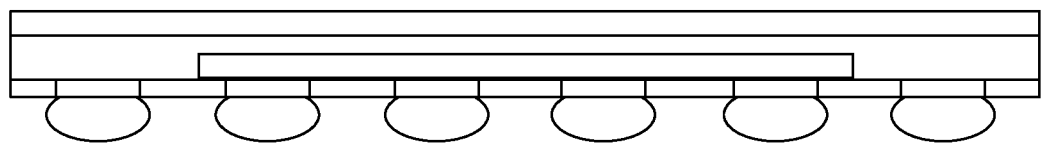
FIG. 1C is a schematic diagram of a fan-out packaging structure of a memory system provided by an implementation of the present disclosure.
Figure 1D:
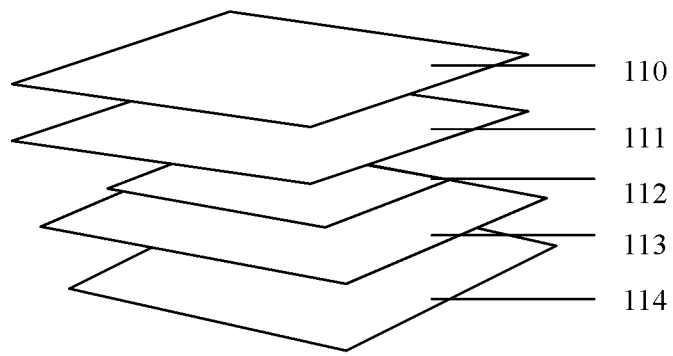
FIG. 1D is a schematic diagram for each layer of a fan-out packaging structure of a memory system according to an implementation of the present disclosure.

In recent years, the emergence of the fan-out packaging structure of memory dies and the development of packaging materials are promoting the development of the packaging of memory dies. FIG. 1C is a schematic diagram of a fan-out package structure of memory dies; and FIG. 1D is a schematic diagram of each layer of a fan-out package structure of memory dies. As shown in FIG. 1C and FIG. 1D, the manufacturing method of the fan-out package structure of the memory dies generally includes: providing a substrate 110; forming an adhesive layer 111 on the substrate; photolithographing and electroplating the adhesive layer 111 to form a redistribution layer (RDL) 113; mounting memory dies 112 on the RDL 113 by a bonding process; encapsulating the memory dies in a layer of plastic encapsulation material by an injection molding process; removing the substrate and the adhesive layer; photolithographing and electroplating the RDL to form an under bump metal layer (UBM) 114; and forming metal solder balls on the UBM.

The fan-out packaging structure of memory dies can effectively save packaging space. At the same time, in the fan-out packaging structure, the RDL enables the packaging structure with higher performance, such as good heat dissipation and high frequency. However, the current fan-out packaging structure generally does not support the System In a Package (SIP) of stacked memory dies, that is, memory system packaging. The memory system packaging in the related art is complex.

In the memory system packaging structure provided by implementations of the present disclosure, a memory module is used to obtain a SIP fanout structure. The memory module is in physical contact with and electrically connected to an RDL through connecting pillars, and a memory controller is disposed on a first surface of the RDL and is electrically connected to the RDL. Since the memory module and memory controller are both disposed on the first surface of the RDL and electrically connected to the RDL, the overall line distance can be shortened by more than 40%, which shortens the signal transmission path between the memory module, memory controller, and external devices, so the formed memory system packaging structure has better high-frequency performance. The memory controller does not need wire bonding, which simplifies the processing of the memory system packaging and saves cost. The use of Cu pillar instead of gold wire can further reduce the cost, and decrease the parasitic resistance and inductance. The processing of copper pillar is much easier than that of wire bonding, which can shorten the production cycle.

Figure 2:
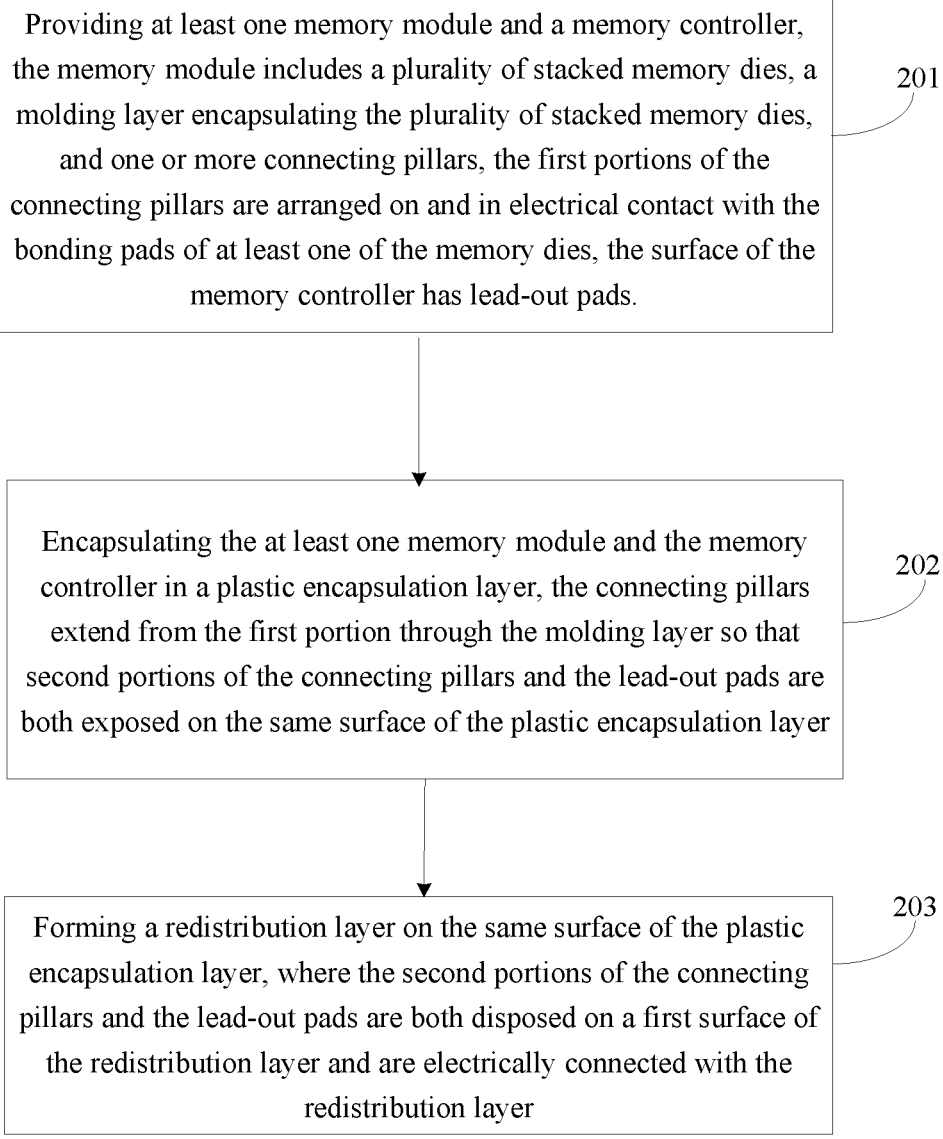
FIG. 2 is a schematic flowchart of a method for manufacturing a memory system packaging structure according to an implementation of the present disclosure.

Implementations of the present disclosure provide a method for manufacturing a memory system packaging structure. FIG. 2 is a schematic flowchart of a method for manufacturing a memory system packaging structure. As shown in FIG. 2, the method includes the following operations.

Operation 201: providing one or more memory modules and a memory controller, each of the one or more memory modules including a plurality of stacked memory dies and the memory controller having lead-out pads; forming one or more connecting pillars, each of the one or more connecting pillars having a first portion disposed on and in electrical contact with a bonding pad of one of the stacked memory dies; and forming a molding layer encapsulating the plurality of memory dies and connecting pillars.

Operation 202: encapsulating the one or more memory modules and the memory controller in a plastic encapsulation layer, the first portion of each connecting pillar extending through the molding layer so that a second portion of each connecting pillar and the lead-out pads of the memory controller are exposed on a same surface of the plastic encapsulation layer.

Operation 203: forming an RDL on the same surface of the plastic encapsulation layer, where the second portion of each connecting pillar and the lead-out pads of the memory controller are both disposed on a first surface of the RDL and are electrically connected with the RDL.

FIGS. 3A-3L are schematic cross-sectional views of operations of a method for manufacturing a memory system packaging structure according to an implementation of the present disclosure. It should be understood that the operations shown in FIG. 2 are not exclusive, and other operations may be performed before, after, or between any of the operations. The manufacturing method of the memory system packaging structure is described below with reference to FIG. 2 and FIG. 3A-FIG. 3L.

Figure 3A:
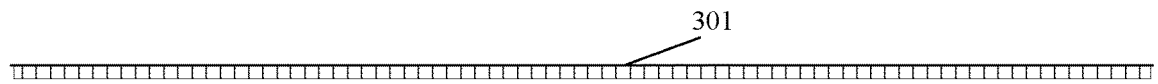
FIG. 3A-3L are schematic diagrams of operations of a method for manufacturing a memory system packaging structure according to an implementation of the present disclosure.
Figure 3B:
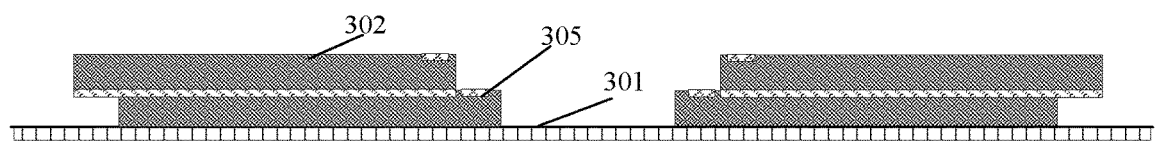
Figure 3C:
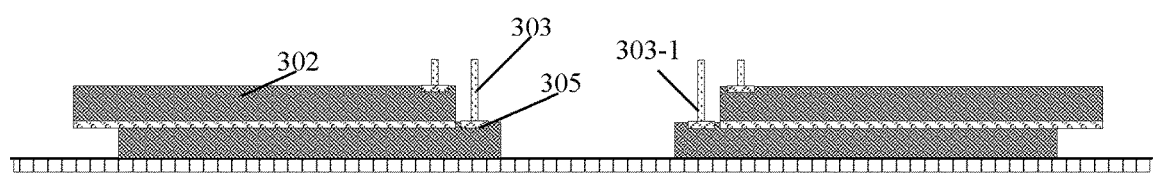
Figure 3D:
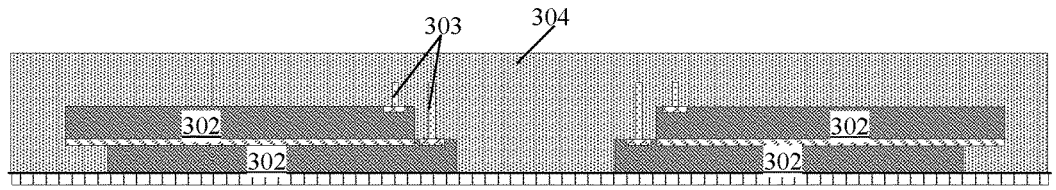
Figure 3E:
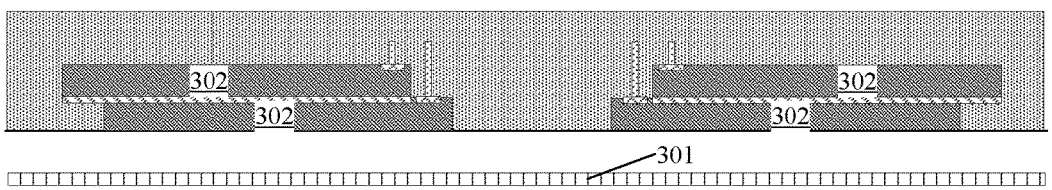
Figure 3F:
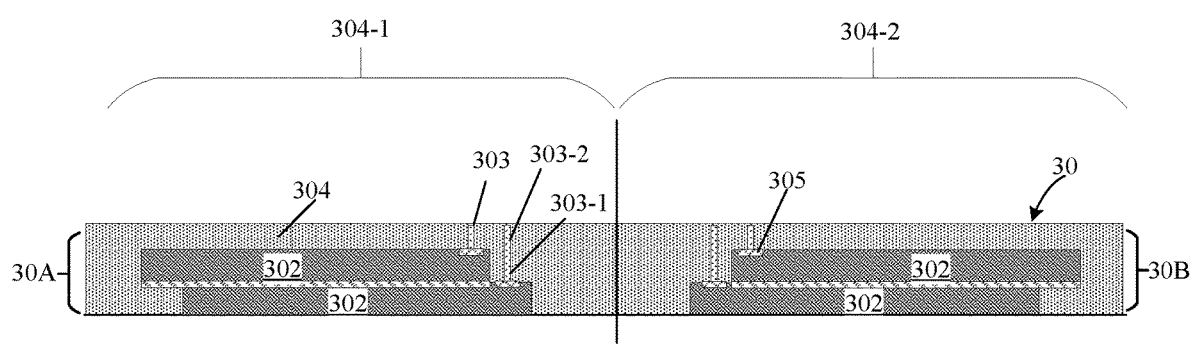

As shown in FIG. 3F, one or more memory modules 30 is provided. Each of the one or more memory modules 30 includes a plurality of stacked memory dies 302, a molding layer 304 that encapsulates the plurality of stacked memory dies 302, and at least one connecting pillar 303 extending from one of the plurality of stacked memory dies 302 through the molding layer 304. The surface of each of the stacked memory dies 302 is provided with at least one bonding pad 305 that is not covered by the adjacent memory die 302. The first portion 303-1 of each connecting pillar 303 is disposed on and in electrical contact with bonding pads 305 of at least one of the stacked memory dies 302, and the second portion 303-2 is exposed on the surface of the molding layer 304.

In some implementations, the plurality of stacked memory dies 302 may include, but are not limited to, NAND flash memory dies. The side and bottom surfaces of each of the stacked memory dies 302 include insulating layers to isolate the memory dies 302 from each other. The material of the molding layer 304 may include an epoxy molding compound (EMC). The connecting pillars 303 are perpendicular to the surface of the stacked memory dies 302, and the connecting pillars 303 may include at least one conductive material, such as copper, gold, aluminum, silver, and/or other suitable metallic materials.

In some implementations, each of the memory modules 30 includes a plurality of stacked memory dies 302, and the electrical connections vary between the plurality of stacked memory dies 302 and the connecting pillars 303.

In some implementations, each of the memory modules 30 includes one connecting pillar 303 that is connected to the bonding pad 305 of one of the stacked memory dies 302, and other stacked memory dies 302 are electrically connected to the one connecting pillar 303 through bonding wires.

In some implementations, when each of the memory modules 30 includes a plurality of connecting pillars 303, the electrical connections vary between the plurality of stacked memory dies 302 and the plurality of connecting pillars 303.

In some implementations, each of the memory modules 30 includes a plurality of connecting pillars 303, and the plurality of connecting pillars 303 are respectively bonded to multiple bonding pads of the stacked memory dies 302, and other stacked memory dies 302 are electrically connected to the plurality of connecting pillars 303 through bonding wires.

In some implementations, each of the memory modules 30 includes a plurality of connecting pillars 303. For each die of the stacked memory dies 302, each of the plurality of connecting pillars 303 is in electric contract with the bonding pad of the corresponding one of the stacked memory dies 302.

In some implementations, providing one or more memory modules includes: providing a first carrier 301; stacking a plurality of memory dies 302 in sequence in a misaligned manner, such that a bonding pad of each memory die is uncovered on the first carrier 301; forming one or more connecting pillars 303 having first portions electrically connected to the bonding pads 305 on at least one memory die of the plurality of memory dies 302; forming a molding layer 304 encapsulating the plurality of stacked memory dies 302 and the connecting pillars 303; removing the first carrier 301; and removing partial molding layer 304, thereby exposing the second portion 303-2 of the one or more connecting pillars 303.

In some implementations, as shown in FIG. 3A, a first carrier 301 is provided. In some implementations, the first carrier 301 further includes a temporary bonding film.

As shown in FIG. 3B, a plurality of memory dies 302 are sequentially stacked in a vertical direction on the first carrier 301, and the surface of each of the memory dies 302 is provided with one or more bonding pads 305 that are not covered by adjacent memory dies 302.

In some implementations, the front surfaces of the plurality of stacked memory dies 302 adhere to the temporary bonding film of the first carrier 301. The front surface of each memory dies 302 is the surface where the one or more bonding pads 305 are located.

In some implementations, the plurality of stacked memory dies 302 may be misaligned in any direction parallel to the surfaces of the plurality of stacked memory dies 302. Two adjacent stacked memory dies 302 may be misaligned so that the bonding pads 305 on the surface of one of the memory die 302 are exposed.

As shown in FIG. 3C, one or more connecting pillars 303 having a first portion 303-1 electrically connected to the bonding pads 305 are formed on one or more bonding pads 305 of the plurality of memory dies 302.

In some implementations, the connecting pillars 303 are perpendicular to the surface of the stacked memory dies 302 and are in electrical contact with at least one bonding pad 305 of the stacked memory dies 302. The electrical contact can be understood as two structures in contact and electrically connected.

As shown in FIG. 3D, a molding layer 304 is formed, encapsulating the plurality of stacked memory dies 302 and the one or more connecting pillars 303. In some implementations, the molding layer 304 may completely encapsulate the plurality of stacked memory dies 302 and the one or more connecting pillars 303. The molding layer 304 may protect the plurality of stacked memory dies 302 and reduce physical damages and/or chemical damages (such as oxidation, damage from moisture) of the plurality of stacked memory dies 302.

In some implementations, the material of the molding layer 304 includes but not limit to EMC.

As shown in FIG. 3E, the first carrier 301 is removed.

As shown in FIG. 3F, part of the molding layer 304 is removed, thereby exposing the second portion 303-2 of the one or more connecting pillars 303. In some implementations, part of the molding layer 304 is removed first, and then the first carrier 301 is removed.

In some implementations, part of the molding layer 304 may be removed by grinding, so as to expose the second portion 303-2 of at least one connecting pillar 303. In some implementations, when the molding layer 304 encapsulates a plurality of memory modules 30 at the same time, the molding layer 304 may also be divided into a plurality of molding parts, with each molding part individually encapsulating each of the plurality of memory modules 30 according to subsequent processing requirements. For example, the molding layer 304 as shown in FIG. 3F is cut into two parts 304-1 and 304-2, each part encapsulating one memory module 30 (30A and 30B). It should be noted that the number of the memory modules 30 as shown in FIGS. 3B to 3L are only exemplary, which do not limit the number of memory modules 30 in the implementations of the present disclosure.

In some implementations, a first carrier 301 is provided; a plurality of first memory dies and a plurality of second memory dies are respectively sequentially stacked on the first carrier 301; the plurality of first memory dies and the plurality of second memory dies are arranged in parallel on the first carrier 301; one or more connecting pillars 303 are formed, the connecting pillars have first portions 303-1 that are electrically connected to at least one bonding pad 305 of the plurality of first memory dies and at least one bonding pad 305 of the plurality of second memory dies; a molding layer 304 is formed to encapsulate the plurality of first memory dies, the plurality of second memory dies, and the one or more connecting pillars 303; the first carrier 301 is removed; part of the molding layer 304 is removed to expose second portions 303-2 of the one or more connecting pillars 303; the molding layer 304 is cut to obtain a first memory module 30A including the plurality of first memory dies and a second memory module 30B including the plurality of second memory dies.

In the above implementations, the plurality of memory modules 30 may be formed by using the same molding layer 304. That is, the plurality of memory modules 30 can be formed in the same process at the same time, thereby greatly improving production efficiency and reducing production costs.

Because the plurality of memory dies 302 are stacked together, the footprint of the memory modules 30 can be reduced. The memory modules 30 use connecting pillars 303 rather than conventional wire bonding (for example, bent wires bonded between the bonding pads and a bonding substrate), which can further reduce the offset sizes between memory dies in the memory modules 30 (the distance between ends of traditional bent wires cannot be too close) and shorten the signal transmission path between the memory modules 30 and external devices. Moreover, the use of connecting pillars avoids the bonding substrate used in conventional wire bonding technology, which can save time and cost. In addition, during the manufacturing of memory modules 30, the conventional wire bonding technology is more complex than the connecting pillar technology. Connecting pillars are also more reliable than conventional wire bonding.

In operation 201, a memory controller for controlling the plurality of memory modules is also provided, and the surface of the memory controller is provided with lead-out pads.

Figure 3G:
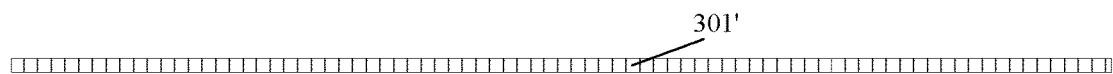
Figure 3H:
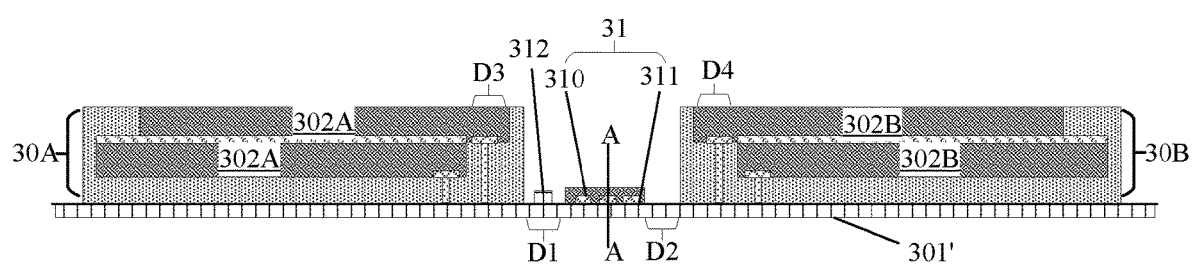
Figure 3I:
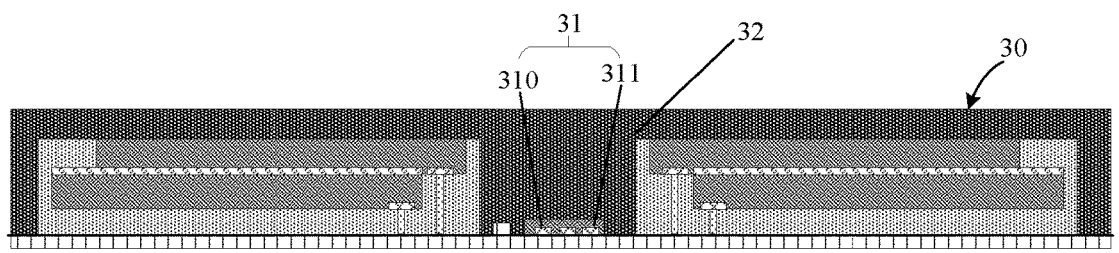
Figure 3J:
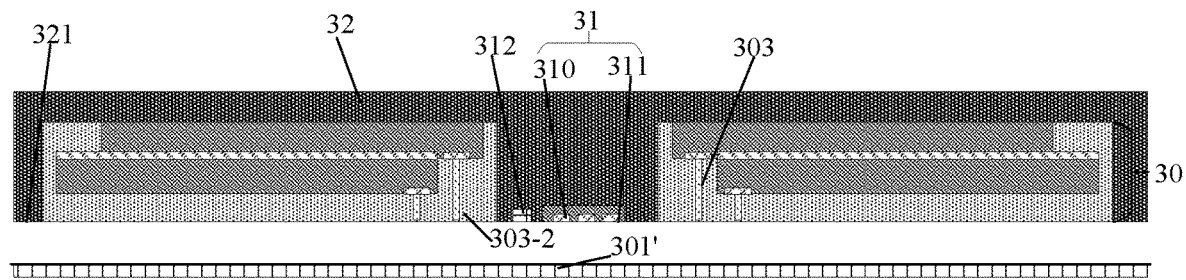
Figure 3K:
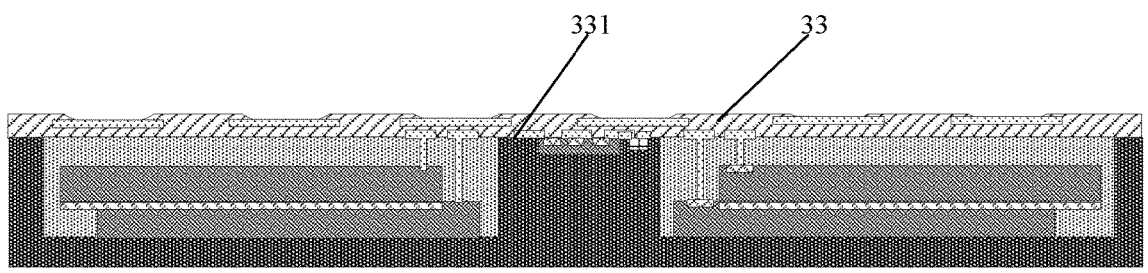

In some implementations, as shown in FIG. 3H and FIG. 3I, the memory system packaging structure further includes one or more passive devices 312 encapsulated in a plastic encapsulation layer 32. The one or more passive devices 312 are arranged in a first surface 331 of an RDL 33 and are electrically connected with the RDL 33 (as shown in FIG. 3K). In some implementations, the one or more passive devices 312 include capacitors, resistors, inductors, or the like. The specific number, position, and type of the one or more passive devices 312 may vary according to practical needs of the memory system packaging structure.

Operation 202. Referring to FIG. 3J, the plurality of memory modules 30 and the memory controller 31 are encapsulated in the plastic encapsulation layer 32. The second portions 303-2 of the one or more connecting pillars 303 in the plurality of memory modules 30 and the lead-out pads 310 on the surface 311 of the memory controller 31 are both exposed on the same surface 321 of the plastic encapsulation layer 32. When the second portions 303-2 of the one or more connecting pillars 303 in the plurality of memory modules 30 are in electrical contact with the RDL 33 as shown in FIG. 3K, the lead-out pads 310 of the memory controller 31 can be directly electrically connected to the RDL 33, so that the signal transmission path of the memory controller 31 can be shortened.

In some implementations, encapsulating the plurality of memory modules 30 and the memory controller 31 in the plastic encapsulation layer 32 includes: providing a second carrier 301'; mounting the plurality of memory modules 30 and the memory controller 31 on the surface of the second carrier 301', so that the second portions 303-2 of the one or more connecting pillars 303 in the plurality of memory modules 30 and the lead-out pads 310 of the memory controller 31 are located on the same surface of the second carrier 301'; forming the plastic encapsulation layer 32 encapsulating the plurality of memory modules 30 and the memory controller 31; and removing the second carrier 301'.

In some implementations, as shown in FIG. 3G, the second carrier 301' is provided. The second carrier 301' may include a temporary bonding film. The temporary bonding film includes an adhesive layer, which is used to attach the plurality of memory modules 30 and the memory controller 31 in subsequent processes.

In some implementations, the plurality of memory modules 30 and the memory controller 31 are mounted on the surface of the second carrier 301', so that the second portions of the one or more connecting pillars 303 in the plurality of memory modules 30 and the lead-out pads 310 of the memory controller 31 are all located on the same surface of the second carrier 301'.

In some implementations, the front surfaces of the plurality of memory modules 30 and the front surface of the memory controller 31 are attached to the temporary bonding film of the second carrier 301'. The front surfaces of the plurality of memory modules 30 are the surfaces where the second portions of the one or more connecting pillars 303 are located, and the front surface of the memory controller is the surface where the lead-out pads 310 are located. When the second carrier 301' and the temporary bonding film on the second carrier 301' are removed in the subsequent process, the second portions of the one or more connecting pillars 303 in the plurality of memory modules 30 and the lead-out pads 310 of the memory controller 31 are all exposed, so as to facilitate the electrical connection with the RDL 33.

In some implementations, the arrangement of the memory modules 30 and the memory controller 31 on the surface of the second carrier 301' may vary. The memory system packaging structure may include two memory modules 30 or one memory module 30, which is described below, respectively.

As shown in FIG. 3H, in some implementations, the plurality of memory modules includes a first memory module 30A and a second memory module 30B. Front surfaces of the first memory module 30A, the second memory module 30B, and the memory controller 31 are attached to the temporary bonding film of the second carrier 301'. The memory controller 31 is located between the first memory module 30A and the second memory module 30B.

In some implementations, the distance between the memory controller 31 and the first memory module 30A is a first distance D1, the distance between the memory controller 31 and the second memory module 30B is a second distance D2, and the first distance D1 is equal to the second distance D2.

In some implementations, the memory controller 31 is located between the first memory module 30A and the second memory module 30B. The first memory module 30A and the second memory module 30B are symmetrically arranged based on the memory controller 31. That is, the signal path from the first memory module 30A to the memory controller 31 and the signal path from the second memory module 30B to the memory controller 31 are symmetrical and consistent, thereby improving the high-frequency performance of the memory system packaging structure.

The symmetrical arrangement of the first memory module 30A and the second memory module 30B based on the memory controller 31 can be understood as, except that some components are not completely symmetrically arranged due to manufacturing, the main components in the first memory module 30A and the main components in the second memory module 30B are symmetrically arranged based on the memory controller 31. When components in the first memory module 30A or components in the second memory module 30B have a certain offset, the signal path between the first memory module 30A and the memory controller 31 and the signal path between the second memory module 30B and the memory controller 31 are not affected and still distributed symmetrically based on the memory controller 31.

The first distance D1 is equal to the second distance D2. The first memory module 30A, the second memory module 30B, and the memory controller 31 are located on a straight line in the first surface 331 (as shown in FIG. 3K). Compared to a case where the first memory module 30A, the second memory module 30B, and the memory controller 31 are not located on a straight line, the signal paths between the first memory module 30A and the memory controller 31 and between the second memory module 30B and the memory controller 31 are shorter when they are located on a straight line.

In some implementations, as shown in FIG. 3H, the first memory module 30A includes a plurality of first memory dies 302A misaligned in a first direction with a third distance D3, and the second memory module 30B includes a plurality of second memory dies 302B misaligned in a second direction with a fourth distance D4. The first direction and the second direction are both perpendicular to the stacking direction of the plurality of memory dies 302, and the first direction is opposite to the second direction.

In some implementations, not only the first memory module 30A and the second memory module 30B are symmetrically arranged based on the memory controller 31, but also the plurality of first memory dies 302A in the first memory module 30A and the plurality of second memory dies 302B in the second memory module 30B are symmetrically arranged based on the center line AA of the memory controller 31 (as shown in FIG. 3H), so that the signal path from the first memory module 30A to the memory controller 31 and the signal path from the second memory module 30B to the memory controller 31 are symmetrical and consistent, which further improves the signal integrity and the high-frequency performance of the memory system packaging structure.

As shown in FIG. 3H, in some implementations, the number of the first memory die 302A is the same as the number of the second memory die 302B; the third distance D3 is equal to the fourth distance D4. Here, the number of memory dies contained in the first memory module 30A and the second memory module 30B are the same, and the distance by which the plurality of first memory dies 302A in the first memory module 30A is shifted in the first direction is equal to the distance by which the plurality of second memory dies 302B in the second memory module 30B is shifted in the second direction. The first memory module 30A and the second memory module 30B may have the same internal structure. The plurality of memory dies 302 in the first memory module 30A and the second memory module 30B are arranged symmetrically based on the centerline AA of the memory controller 31, so that the signal paths from each memory die in the first memory module 30A to the memory controller 31 are symmetrical to and consistent with the signal paths from each memory die in the second memory module 30B to the memory controller 31, thus promoting the signal integrity of the memory system.

In some implementations, the first memory module 30A and the second memory module 30B may have the same internal structures and the same memory dies, and are respectively arranged on both sides of the memory controller 31. In some implementations, the first memory module 30A and the second memory module 30B are symmetrically arranged based on the center line AA of the memory controller 31 on which the lead-out pads 310 are correspondingly provided.

FIG. 3H shows exemplary implementations for the arrangement of the memory system packaging structure including two memory modules 30. The following describes the arrangement of the memory system packaging structure including one memory module 30.

In some implementations, the memory system packaging structure includes one memory module 30. Front surfaces of the one memory module 30 and the memory controller 31 are attached to the temporary bonding film of the second carrier 301'. The memory controller 31 is located on the side of the one memory module 30.

As shown in FIG. 3I, in some implementations, a plastic encapsulation layer 32 is formed to encapsulate the one memory module 30 and the memory controller 31.

In some implementations, the plastic encapsulation layer 32 may completely encapsulate the memory module 30 and the memory controller 31, and reduce their physical damages and/or chemical damages (such as oxidation or damage from moisture). The material of the plastic encapsulation layer 32 includes but is not limited to EMC.

The materials of the plastic encapsulation layer 32 and the molding layer 304 may be the same or different. In some implementations, the materials of the plastic encapsulation layer 32 and the molding layer 304 may include EMC or Ajinomoto Build-up Film (ABF).

As shown in FIG. 3J, the second carrier 301' is removed, so that the second portions 303-2 of the connecting pillars 303 in the memory module 30 and the lead-out pads 310 of the memory controller 31 are both exposed to the same surface 321 of the plastic encapsulation layer 32. Here, the same surface 321 of the plastic encapsulation layer 32 is the surface of the plastic encapsulation layer 32 in contact with the second carrier 301'.

Operation 203. Refer to FIG. 3K and FIG. 3J, the RDL 33 is formed on the same surface 321 of the plastic encapsulation layer. The memory module 30 is electrically connected to the RDL through physical contact between the second portions of the connecting pillars 303 and the RDL. The memory controller 31 is disposed on the first surface 331 of the RDL 33 and is electrically connected to the RDL 33 through the lead-out pads 310.

In some implementations, the RDL 33 may include at least one conductive layer and at least one insulating layer. The conductive layer may be electrically connected to the second portions 303-2 of the connecting pillars 303. The conductive layer may include metal or other suitable conductive materials, or a combination thereof. The insulating layer may include an organic or inorganic material such as silicon oxide, silicon nitride, silicon oxynitride, or other suitable insulating materials, or a combination thereof.

The second portions 303-2 of the connecting pillars 303 in the memory module 30 and the lead-out pads 310 of the memory controller 31 are both exposed on the same surface 321 of the plastic encapsulation layer 32, so that when the RDL 33 is formed in operation 203, the memory controller 31 can be electrically connected to the RDL 33 by soldering, thereby shortening the signal transmission path of the memory controller 31 and improving the high-frequency performance of the memory system packaging structure.

Figure 3L:
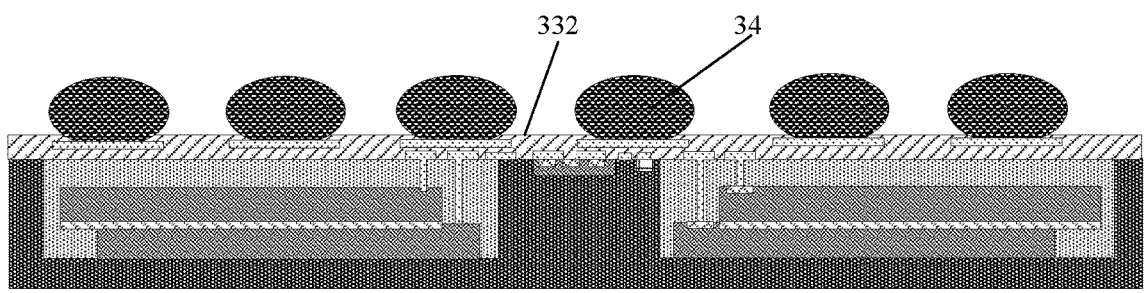

Refer to FIG. 3L and FIG. 3K, metal solder balls 34 are formed on the second surface 332 of the RDL 33. Through the RDL 33, the metal solder balls 34 are electrically connected to memory module 30 and memory controller 31 located on the first surface 331 of the RDL 33. The second surface 332 and the first surface 331 are opposite to each other.

In some implementations, the insulating layer of the RDL 33 may have a plurality of openings to expose portions of the conductive layer, and the plurality of openings corresponds to the metal solder balls 34. In this case, the metal solder balls 34 may function as signal input/output terminals. Through the metal solder balls 34, signals from external devices can be input into the memory system packaging structure, and/or signals from the memory system packaging structure can be output to external devices. In some implementations, the metal solder balls 34 may be electrically connected to at least one of the connecting pillars 303 and the memory controller 31.

It should be noted that although exemplary implementations of forming the memory system packaging structure are described herein, it shall be understood that one or more operations may be omitted from the formation of the memory system packaging structure.

Figure 4A:
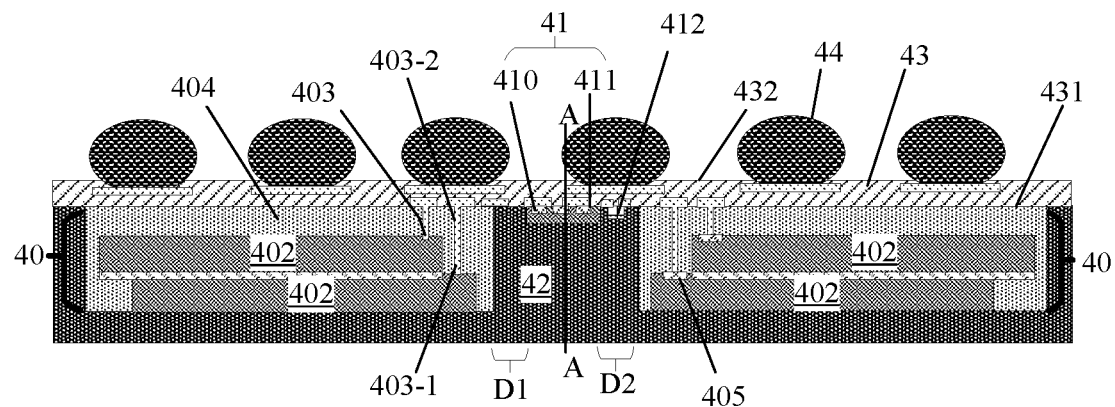
FIG. 4A is a schematic cross-sectional view of a memory system packaging structure according to an implementation of the present disclosure.
Figure 4B:
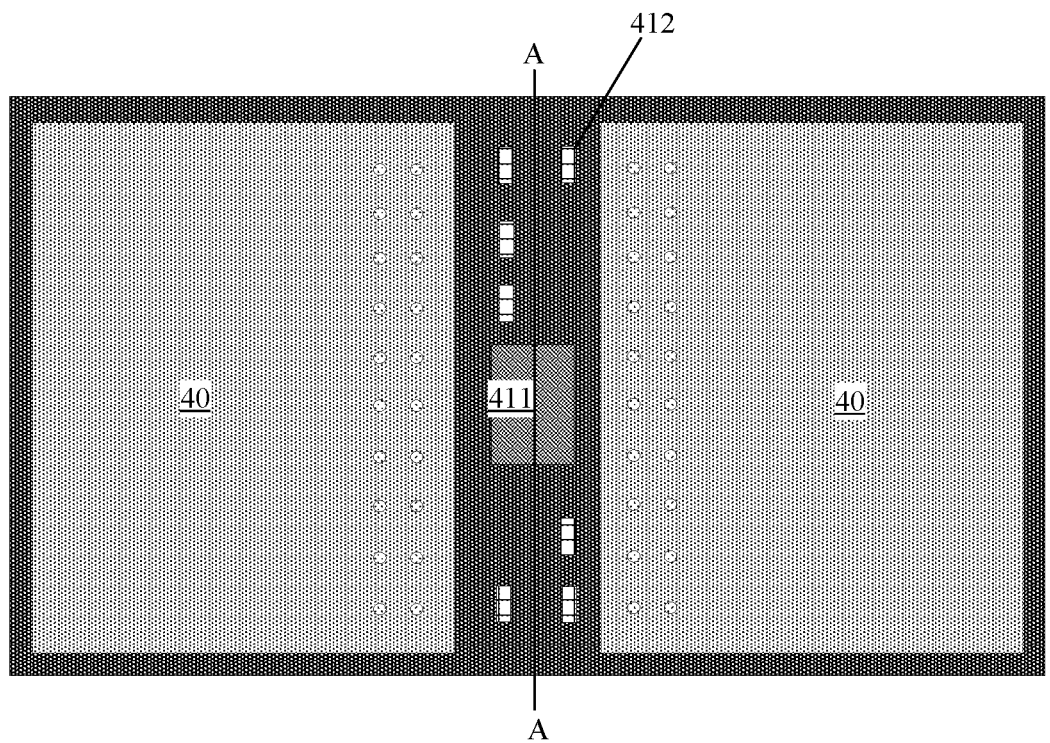
FIG. 4B is a schematic top view of a packaging structure of a memory system according to an implementation of the present disclosure.

FIG. 4A is a schematic cross-sectional view of a memory system packaging structure according to some implementations of the present disclosure, and FIG. 4B is a schematic top view of the memory system packaging structure according to some implementations of the present disclosure. As shown in FIG. 4A and FIG. 4B, the memory system packaging structure includes at least one of the memory modules 40, a memory controller 41, a plastic encapsulation layer 42 encapsulating the memory modules 40 and the memory controller 41, and an RDL 43. Each of the memory modules 40 includes a plurality of memory dies 402 stacked in a vertical direction, a molding layer 404 encapsulating the plurality of memory dies 402, and one or more connecting pillars 403. The first portions 403-1 of the one or more connecting pillars 403 are disposed on and in electrical contact with bonding pads 405 of at least one of the memory dies 402, and the one or more connecting pillars 403 extend from the first portion 403-1 through the molding layer 404 so that the second portions 403-2 of the connecting pillars 403 are disposed on the first surface 431 of the RDL 43 and electrically connected with the RDL 43. The memory system packaging structure may include metal solder balls 44 formed on the second surface 432 of the RDL 43. Through the RDL 43, the metal solder balls 44 are electrically connected to memory module 40 and memory controller 41 located on the first surface 431 of the RDL 43. The second surface 432 and the first surface 431 are opposite to each other. The memory system packaging structure may further include one or more passive devices 412 arranged in the first surface 431 of the RDL 43 and are electrically connected with the RDL 43.

The surface 411 of the memory controller 41 is provided with lead-out pads 410. The memory controller 41 is disposed on the first surface 431 of the RDL 43 and is electrically connected to the RDL 43 through the lead-out pads 410.

In some implementations, the side and bottom surfaces of each memory die 402 in the plurality of stacked memory dies 402 include insulating layers, which insulate and protect the memory die 402, as well as increase the mechanical strength of memory dies 402, thus improving the reliability of the memory system packaging structure.

In some implementations, the plurality of stacked memory dies 402 may be misaligned in any direction parallel to the surfaces of the plurality of stacked memory dies 402. Two adjacent stacked memory dies 402 may be misaligned so that the bonding pads 405 on the surface of the memory dies 402 are exposed.

In some implementations, the plurality of stacked memory dies 402 are stacked in a stepped shape, and the exposed stepped surface of each memory dies 402 of the plurality of stacked memory dies 402 has multiple bonding pads 405. Except for the bottommost memory die 402, other memory dies 402 of the plurality of stacked memory dies 402 are all misaligned in a first direction so that the bonding pads 405 on the surfaces of the plurality of stacked memory dies 402 are all exposed. The first direction is perpendicular to the direction in which the plurality of stacked memory dies 402 are stacked.

Figure 5A:
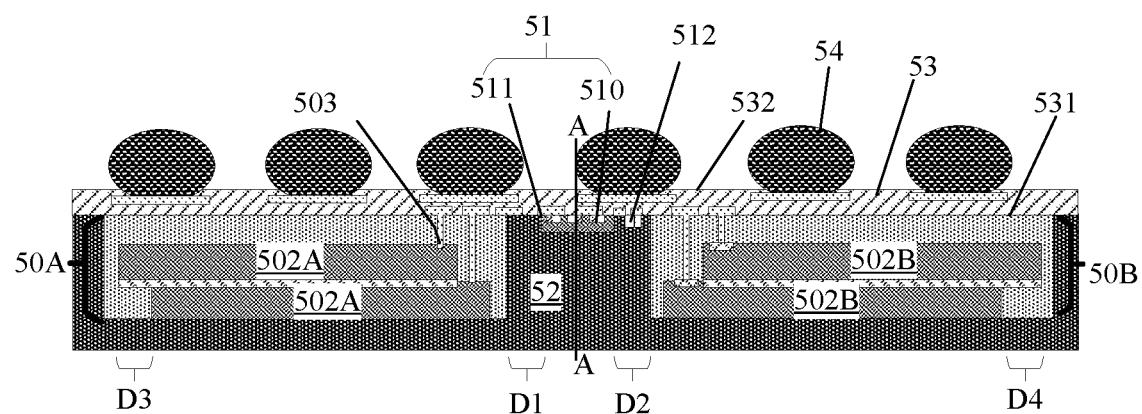
FIG. 5A is a schematic cross-sectional view of a memory system packaging structure according to an implementation of the present disclosure.

As shown in FIG. 5A, the memory system packaging structure includes a first memory module 50A, a second memory module 50B, a memory controller 51, a plastic encapsulation layer 52 encapsulating the memory modules and the memory controller 51, and an RDL 53. The memory controller 51 is located between the first memory module 50A and the second memory module 50B. In some implementations, the memory system packaging structure may include metal solder balls 54 formed on the second surface 532 of the RDL 53. The memory system packaging structure may further include one or more passive devices 512 arranged in the first surface 531 of the RDL 53 and are electrically connected with the RDL 53.

In some implementations, the distance between the memory controller 51 and the first memory module 50A is the first distance D1 (as shown in FIG. 3H), and the distance between the memory controller 51 and the second memory module 50B is the second distance D2 (as shown in FIG. 3H). The first distance D1 is equal to the second distance D2.

The surface 511 of the memory controller 51 is provided with lead-out pads 510. The memory controller 51 is disposed on the first surface 531 of the RDL 53 and is electrically connected to the RDL 43 through the lead-out pads 410.

Referring to FIG. 5A, the memory controller 51 is located between the first memory module 50A and the second memory module 50B. The first memory module 50A and the second memory module 50B are symmetrically arranged based on the memory controller 51. That is, the signal path from the first memory module 50A to the memory controller 51 and the signal path from the second memory module 50B to the memory controller 51 are symmetrical and consistent, thereby improving the high-frequency performance of the memory system packaging structure.

As shown in FIG. 5A, the first memory module 50A, the second memory module 50B, and the memory controller 51 are located on a straight line in the first surface 531. Compared to a case where the first memory module 50A, the second memory module 50B, and the memory controller 51 are not located on a straight line, the signal paths between the first memory module 50A and the memory controller 51 and between the second memory module 50B and the memory controller 51 are shorter when they are located on the straight line.

In some implementations, as shown in FIG. 5A, the first memory module 50A includes a plurality of first memory dies 502A stacked in a vertical direction and misaligned in the first direction with the third distance D3 (as shown in FIG. 3H), and the second memory module 50B includes a plurality of second memory dies 502B misaligned in the second direction with the fourth distance D4 (as shown in FIG. 3H). The first direction and the second direction are both perpendicular to the stacking direction of the plurality of memory dies 502, and the first direction is opposite to the second direction.

In some implementations, not only the first memory module 50A and the second memory module 50B are symmetrically arranged based on the memory controller 51, but also the plurality of first memory dies 502A in the first memory module 50A and the plurality of second memory dies 502B in the second memory module 50B are symmetrically arranged based on the center line AA of the memory controller 51, so that the signal path from the first memory module 50A to the memory controller 51 and the signal path from the second memory module 50B to the memory controller 51 are symmetrical and consistent, which further improves the signal integrity and the high-frequency performance of the memory system packaging structure.

As shown in FIG. 5A, in some implementations, the number of the first memory die 502A is the same as the number of the second memory die 502B, and the distance by which the plurality of first memory dies 502A in the first memory module 50A is misaligned in the first direction is equal to the distance by which the plurality of second memory dies 502B in the second memory module 50B is misaligned in the second direction. The first memory module 50A and the second memory module 50B may have the same internal structure. The plurality of memory dies 502 in the first memory module 50A and the second memory module 50B are arranged symmetrically based on the centerline AA of the memory controller 51, so that the signal paths from each memory die in the first memory module 50A to the memory controller 51 are symmetrical to and consistent with the signal paths from each memory die in the second memory module 50B to the memory controller 51, thus promoting the signal integrity of the memory system.

Figure 5B:
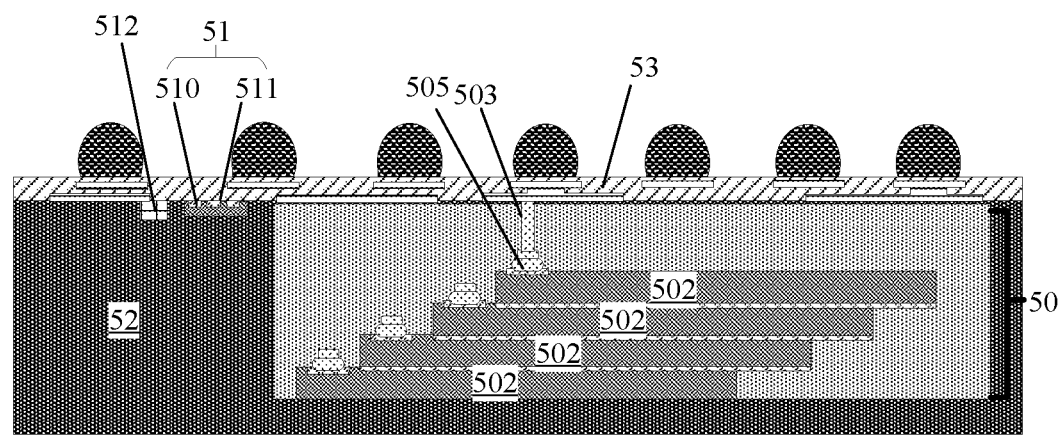
FIG. 5B is a schematic cross-sectional view of a memory system packaging structure according to an implementation of the present disclosure.

In some implementations, as shown in FIG. 5B, the memory system packaging structure includes one memory module 50, and the memory controller 51 is located on one side of the one memory module 50.

In some implementations, as shown in FIG. 5B, each of the memory modules 50 includes a plurality of memory dies 502, and the electrical connection varies between the plurality of memory dies 502 and the connecting pillars 503.

In some implementations, each of the memory modules 50 includes one connecting pillar 503, and the one connecting pillar 503 is connected to the bonding pad 505 of one memory die of the plurality of memory dies 502. Other memory dies of the plurality of memory dies 502 are electrically connected to the connecting pillars 503 through bonding wires.

In some implementations, when each of the memory modules 50 includes one connecting pillar 503, the memory system packaging structure may include at least one bonding wire, and other memory dies in the plurality of memory dies 502 may be electrically connected to the one connecting pillar 503 through bonding wires in various ways. Two methods to realize the electrical connection between the plurality of memory dies 502 and the one connecting pillar 503 are described below.

Figure 6A:
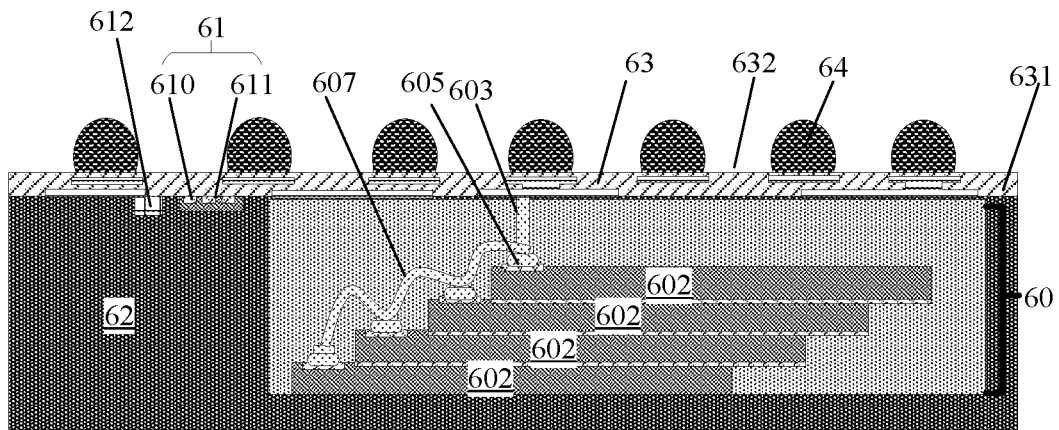
FIG. 6A is a schematic cross-sectional view of another memory system packaging structure according to an implementation of the present disclosure.

Method 1: as shown in FIG. 6A, any two adjacent memory dies 602 in a plurality of memory dies 602 are electrically connected by bonding wires 607, and one connecting pillar 603 is connected to a bonding pad 605 of one memory die of the plurality of memory dies 602. In this way, each of the memory dies 602 in the memory module 60 is electrically connected to an RDL 63 through the one connecting pillar 603.

Method 2: one connecting pillar 603 is in electrical contact with the bonding pad 605 of one memory die of the plurality of memory dies 602, and other memory dies are directly connected to the connecting pillars through bonding wires 607.

In some implementations, when each of the memory modules 60 includes a plurality of connecting pillars 603, the electrical connection varies between the plurality of memory dies 602 and the plurality of connecting pillars 603. Two methods to realize the electrical connection between the plurality of memory dies 602 and the plurality of connecting pillars 603 are described below.

Figure 6B:
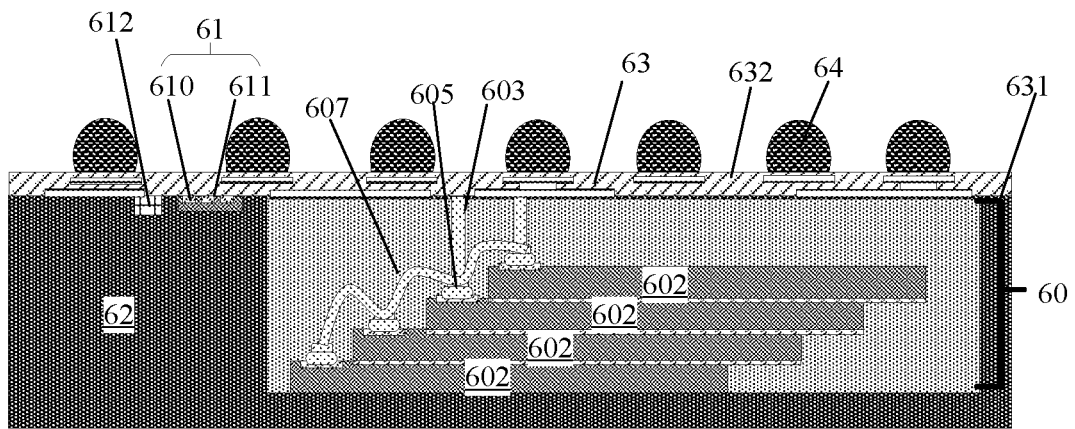
FIG. 6B is a schematic cross-sectional view of yet another memory system packaging structure according to an implementation of the present disclosure.

Method 1: as shown in FIG. 6B, each of the memory modules 60 includes a plurality of connecting pillars 603, and the plurality of connecting pillars 603 are respectively connected to the bonding pads 605 of partial memory dies in the plurality of memory dies 602. Other memory dies of the plurality of memory dies 602 are electrically connected to the plurality of connecting pillars 603 through bonding wires 607.

Figure 6C:
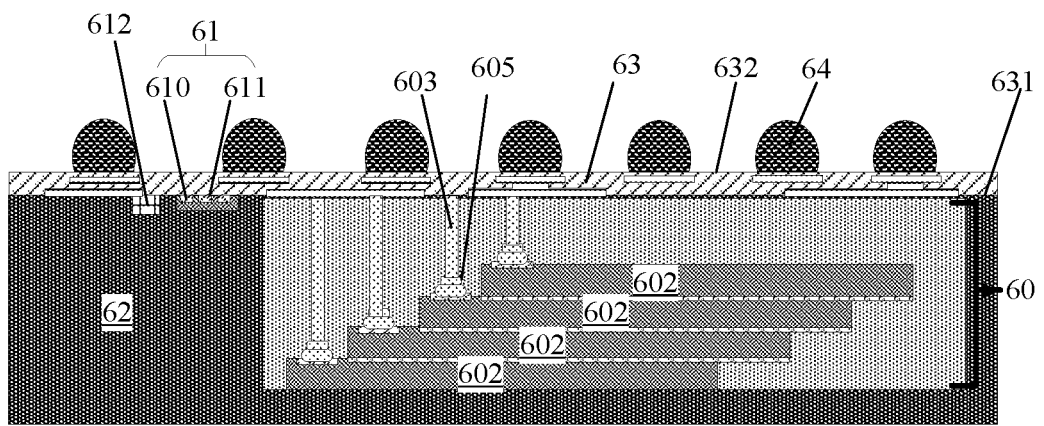
FIG. 6C is a schematic cross-sectional view of still another memory system packaging structure according to an implementation of the present disclosure.

Method 2: as shown in FIG. 6C, each of the memory modules 60 includes a plurality of connecting pillars 603, and the plurality of connecting pillars 603 are respectively connected to corresponding bonding pads 605 of memory dies 602.

In some implementations, the connecting pillars 603 are formed on each of the plurality of memory dies 602. Each of the memory dies 602 is electrically connected to the RDL 63 through the connecting pillars 603. Each memory die 602 does not need additional bonding wires 607 for signal transmission with external devices, thereby improving the reliability during the manufacturing of the memory system packaging structure.

In some implementations, the surface 611 of the memory controller 61 is provided with lead-out pads 610. The memory controller 61 is disposed on the first surface 631 of the RDL 63 and is electrically connected to the RDL 63 through the lead-out pads 610.

In some implementations, the memory system packaging structure includes metal solder balls 64 on a second surface 632 of the RDL 63. Through the RDL 63, the metal solder balls 64 are electrically connected to memory module 60 and memory controller 61 located on the first surface 631 of the RDL 63. The second surface 632 and the first surface 631 are opposite to each other.

In some implementations, the memory system packaging structure further includes one or more passive devices 612 encapsulated in the plastic encapsulation layer 62. The one or more passive devices 612 are disposed on the first surface 631 of the RDL 63 and electrically connected to the RDL 63. The one or more passive devices 612 include capacitors, resistors, inductors, or the like. The specific number, position, and type of the one or more passive devices 612 may vary according to practical needs of the memory system packaging structure.

In some implementations, the memory die 602 may be a three-dimensional (3D) NAND flash memory die.

The above exemplary memory system packaging structure can be used to form various products of memory system, such as Universal Flash Memory (UFS), Embedded Multimedia Card (eMMC), Personal Computer Memory (PC) Card, CF Card, Smart Media (SM) Card, Memory Stick, Multimedia Card (MMC), SD Card, SSD, etc. The memory controller in the memory system package structure can control the operations of one or more memory dies of the memory module, such as read, erase, and program. The memory controller can also be configured to manage various functions, including but not limited to bad block management, garbage collection, wear leveling, etc. Any other suitable functions may also be performed by the memory controller, such as formatting the memory dies. The memory controller may communicate with external devices according to a particular communication protocol. For example, the memory controller can communicate with external devices through at least one of various interface protocols, such as USB protocol, MMC protocol, peripheral component interconnect (PCI) protocol, serial bus protocol, Advanced Technology Attachment (ATA) protocol, Serial-ATA protocol, Parallel-ATA20 protocol, Small Computer Small Interface (SCSI) protocol, Enhanced Small Disk Interface (ESDI) protocol, Integrated Drive Electronics (IDE) agreement, etc.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory system packaging structure, comprising:
   memory modules comprising a first memory module and a second memory module, each memory module comprising memory dies stacked in a vertical direction;
   a memory controller, wherein the first memory module and the second memory module are respectively positioned on two sides of the memory controller;
   a redistribution layer electrically having a first surface connected to the memory controller;
   a plastic encapsulation layer encapsulating the memory modules, the memory controller, and the redistribution layer; and
   one or more connecting pillars extending in the vertical direction and configured for providing electric power to the memory modules,
   wherein each connecting pillar comprises:
   a first portion being in physical contact with one of the memory dies; and
   a second portion being in physical contact with the redistribution layer.

2. The memory system packaging structure according to claim 1, wherein the first memory module has a first distance from the memory controller, the second memory module has a second distance from the memory controller, and the first distance is the same as the second distance.

3. The memory system packaging structure according to claim 2, wherein the first memory module, the second memory module, and the memory controller are arranged in a straight line, such that the memory controller is located between the first memory module and the second memory module.

4. The memory system packaging structure according to claim 3, wherein edges of two adjacent dies of the stacked dies are misaligned such that an upper one of the two adjacent dies has an extended portion located beyond a lower one of the two adjacent dies, and the lower one of the two adjacent dies has an uncovered portion located beyond the upper one of the two adjacent dies; and
   the uncovered portion of the lower one of the two adjacent dies includes a bonding pad.

5. The memory system packaging structure according to claim 4, wherein the first memory module comprises first memory dies misaligned in a first direction by a third distance, and the second memory module comprises second memory dies misaligned in a second direction by a fourth distance, and the third distance is equal to the fourth distance.

6. The memory system packaging structure according to claim 5, wherein the first memory dies and the second memory dies are both stacked in the vertical direction, the first direction and the second direction are both perpendicular to the vertical direction, and the first direction is opposite to the second direction.

7. The memory system packaging structure according to claim 6, wherein a first number of the first memory dies is equal to a second number of the second memory dies.

8. The memory system packaging structure according to claim 7, wherein one connecting pillar in the first memory module is physically attached to the bonding pad of one of a first subset of the first memory dies, while a second subset of memory dies of the first memory dies are connected to the first portion of the connecting pillar in the first memory module by bonding wires; and
one connecting pillar in the second memory module is physically attached to the bonding pad of one of a second subset of the second memory dies, while a second subset of memory dies of the second memory dies are connected to the first portion of the connecting pillar in the second memory module by bonding wires.

9. The memory system packaging structure according to claim 7, wherein each connecting pillar in the first memory module is respectively physically attached to the bonding pad of each of the first memory dies; and
each connecting pillar in the second memory module is respectively physically attached to the bonding pad of each of the second memory dies.

10. The memory system packaging structure according to claim 8, wherein the one or more connecting pillars comprise one or more copper pillars.

11. The memory system packaging structure according to claim 10, further comprising:
metal solder balls located on a second surface of the redistribution layer, wherein the metal solder balls are electrically connected to the memory modules and the memory controller through the redistribution layer, and the second surface and the first surface are opposite to each other.

12. The memory system packaging structure according to claim 11, further comprising:
at least one passive device encapsulated in the plastic encapsulation layer, wherein the at least one passive device is disposed on the first surface of the redistribution layer and electrically connected to the redistribution layer.

13. The memory system packaging structure according to claim 12, wherein the first memory dies and the second memory dies comprise three-dimensional NAND flash memory dies.

14. A memory system packaging structure, comprising:
a memory module, comprising memory dies stacked in a vertical direction;
a memory controller;
a redistribution layer having a first surface electrically connected to the memory controller;
a plastic encapsulation layer encapsulating the memory module, the memory controller, and the redistribution layer; and
one or more connecting pillars extending in the vertical direction and configured for providing electric power to the memory module,
wherein each connecting pillar comprises:
a first portion being in physical contact with one of the memory dies; and
a second portion being in physical contact with the redistribution layer,
wherein edges of two adjacent dies of the stacked dies are misaligned such that an upper one of the two adjacent dies has an extended portion located beyond a lower one of the two adjacent dies, and the lower one of the two adjacent dies has an uncovered portion located beyond the upper one of the two adjacent dies; and the uncovered portion of the lower one of the two adjacent dies includes a bonding pad.

15. The memory system packaging structure according to claim 14, wherein one connecting pillar in the memory module is physically attached to the bonding pad of one of a first subset of the memory dies, while a second subset of memory dies of the memory dies are connected to the first portion of the one connecting pillar in the memory module by bonding wires.

16. The memory system packaging structure according to claim 14, wherein at least two connecting pillars in the memory module are respectively physically attached to two bonding pads of two of a first subset of the memory dies, while a second subset of memory dies of the memory dies are connected to first portions of the two connecting pillars in the memory module by bonding wires.

17. The memory system packaging structure according to claim 14, wherein each connecting pillar in the memory module is respectively physically attached to the bonding pad of each of the memory dies.

18. A method for packaging a memory system, comprising:
providing memory modules including a first memory module and a second memory module, each memory module comprising memory dies stacked in a vertical direction, and one or more connecting pillars configured for providing electric power to the memory modules;
providing a memory controller having a lead-out pad;
mounting the memory modules and the memory controller to a first surface of a redistribution layer, wherein the first memory module and the second memory module are respectively positioned on two sides of the memory controller, and the redistribution layer is configured to electrically connect the one or more connecting pillars of the memory modules to the lead-out pad of the memory controller; and
forming a plastic encapsulating layer encapsulating the memory modules, the memory controller, the redistribution layer, and the one or more connecting pillars.

19. The memory system packaging structure according to claim 14, wherein the one or more connecting pillars comprise one or more copper pillars.

20. The memory system packaging structure according to claim 14, further comprising:
metal solder balls located on a second surface of the redistribution layer, wherein the metal solder balls are electrically connected to the memory module and the memory controller through the redistribution layer, and the second surface and the first surface are opposite to each other.

* * * * *